United States Patent [19]

Hayakawa et al.

[11] Patent Number: 4,922,461
[45] Date of Patent: May 1, 1990

[54] STATIC RANDOM ACCESS MEMORY WITH ADDRESS TRANSITION DETECTOR

[75] Inventors: Shigeyuki Hayakawa, Yokohama; Masataka Matsui, Tokyo, both of Japan

[73] Assignee: Kabushiki Kaisha Toshiba, Kawasaki, Japan

[21] Appl. No.: 329,717

[22] Filed: Mar. 28, 1989

[30] Foreign Application Priority Data

Mar. 30, 1988 [JP] Japan .................................. 63-74518
Mar. 30, 1988 [JP] Japan .................................. 63-74519

[51] Int. Cl.⁵ ............................................. G11C 13/00
[52] U.S. Cl. ................... 365/230.08; 365/207; 365/189.08; 365/233.5
[58] Field of Search ................ 365/207, 208, 189.08, 365/233, 233.5, 203, 190, 189.05, 230.08

[56] References Cited

U.S. PATENT DOCUMENTS 4,592,026 5/1986 Matsukawa et al. ............... 365/233.5
4,592,028 5/1986 Konishi ............................. 365/233.5
4,612,631 9/1986 Ochii ................................ 365/233.5
4,701,889 10/1987 Ando ................................ 365/233.5

Primary Examiner—Terrell W. Fears
Attorney, Agent, or Firm—Finnegan, Henderson, Farabow, Garrett and Dunner

[57] ABSTRACT

When an address transition detector detects a transition of an address signal, it produces an address transition detect signal. The signal drives a bit line initializing circuit which in turn initializes paired bit lines, and initializes the paired output lines of a sense amplifier. At the same time, a clock signal generator generates a clock signal for a predetermined period of time in accordance with the address transition detect signal. The clock signal is supplied to the sense amplifier and a data output circuit. The sense amplifier is active during a period that the clock signal from the clock signal generator is in an effective level. The output terminal of the data output circuit is placed in a high impedance state during the period that the clock signal is in an effective level. During the other periods than the effective level period, the data output circuit produces a signal corresponding to the data as is read out of a memory cell and outputted by the sense amplifier.

12 Claims, 5 Drawing Sheets

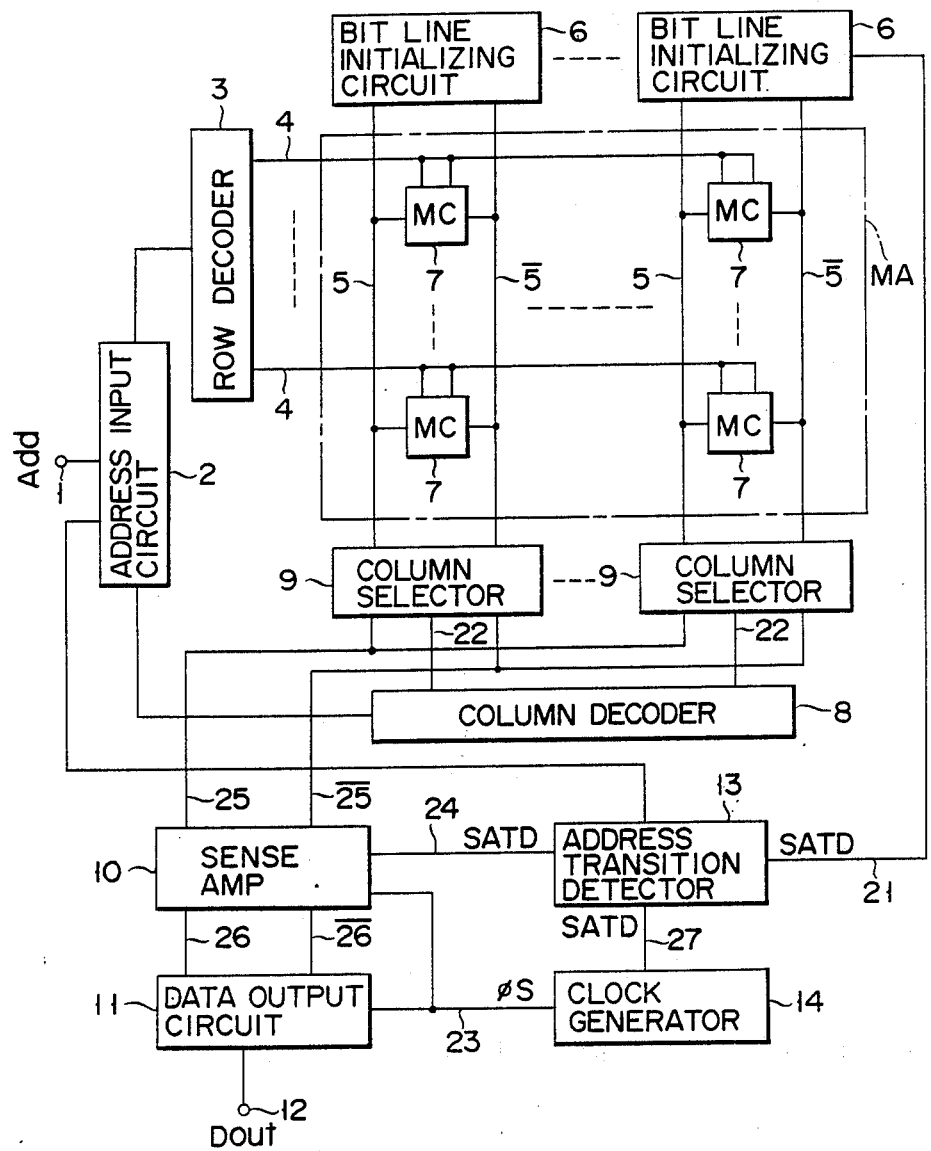
F I G. 1

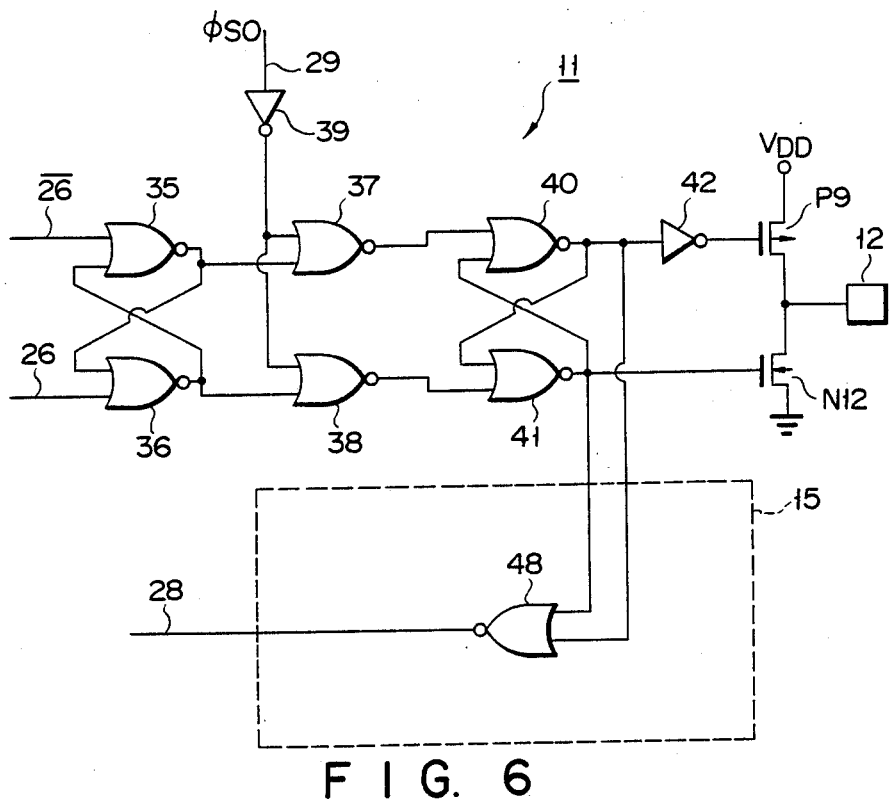
F I G. 6
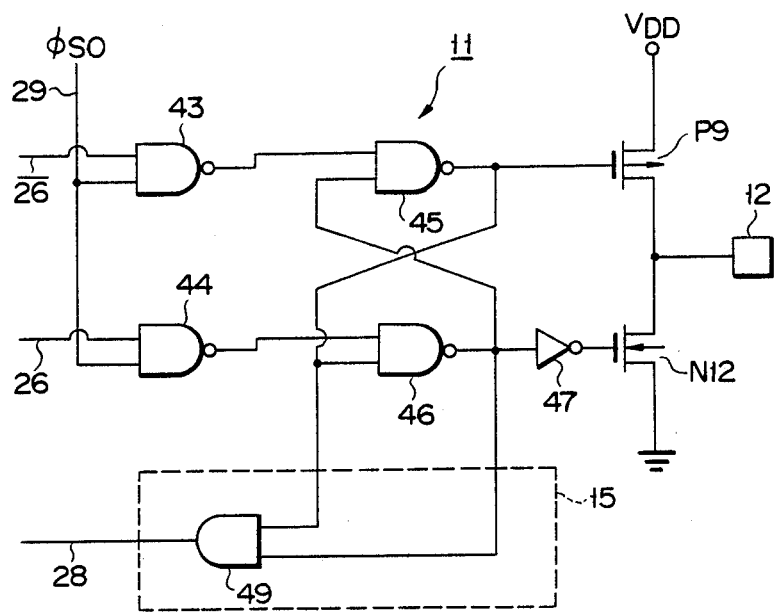
F I G. 7

STATIC RANDOM ACCESS MEMORY WITH ADDRESS TRANSITION DETECTOR

BACKGROUND OF THE INVENTION

1. Field of the Invention

The present invention relates to a static random access memory (SRAM) with address transition detector (ATD).

2. Description of the Related Art

The SRAM is described in, for example, IEEE Journal of Solid-State Circuits, Vol. SC-19, No. 5, October 1984, "A LOW POWER 46ns 256kbit CMOS STATIC RAM WITH DYNAMIC DOUBLE WORD LINE", Sakurai et al., and 1987 IEEE Journal of Solid-State Circuits Conference DIGEST OF TECHNICAL PAPERS "A 25ns 1Mb CMOS SRAMs" Ohtani et al. The SRAMs discussed in these papers contain ATDs.

In this type of the SRAM, the output stage of a data output circuit is provided with a pull-up transistor for pulling up a potential at the data output terminal, and a pull-down transistor for pulling down the potential at that terminal. In accordance with the data read out from a selected memory cell, one of those transistors is turned on, while the other is turned off. Accordingly, a high level signal or a low level signal is derived from the data output terminal in accordance with the data stored in the selected memory cell. Then, when another memory cell is selected, one of the transistors is turned on, while the other is turned off in accordance with the data read out from the memory. In this case, if the new data is different from the previous data, there is the possibility that the pull-up and pull-down transistors are both turned on concurrently. If both the transistors are currently turned on, a through-current flows through a path between a power source and a ground point. The through-current possibly causes power noise, so that the data read time delays and the memory device malfunctions. These problem is noticeable particularly in the memory device of the type operating at a high speed.

SUMMARY OF THE INVENTION

Accordingly, an object of the present invention is to provide a static random access memory capable of minimizing the read time delay and the malfunction, which arise from the power noise.

To achieve the above object, there is provided a static random access memory comprised of: a memory cell array containing a plurality of static memory cells for storing data arrayed in a matrix fashion; word lines for selecting rows of the memory cells in the memory cell array, the word lines being arranged along with the rows of the memory cell array; bit line pairs arranged the columns of the memory cells in the memory cell array, the bit line pairs each selecting one column of the memory cells to transfer data to and from one of the memory cells of the selected column; an address input circuit receiving an address signal to select one of the memory cells of the memory cell array; a row decoder for decoding a row address signal supplied from the address input circuit to selectively drive the word lines; a column decoder for decoding a column address signal supplied from the address input circuit to select one of the bit line pairs; an address transition detector for detecting a transition of an address signal supplied from the address input circuit, to generate an address transition detect signal; a bit line initializing circuit being under control of an address transition detect signal outputted from the address transition detector, when a transition of the address signal is detected, the bit line initializing circuit initializing a potential of each the bit line pair to a predetermined potential; a clock signal generator being coupled for reception an address transition detect signal from the address transition detector, the clock signal generator generating during a predetermined period of time elapsing from generation of the address transition detect signal in a read mode; a sense amplifier for amplifying the data as is read out from one selected memory cell to the bit line pair associated with the selected memory cell, the sense amplifier being initialized by an address transition detect signal generated by the address transition detector and neutralized during a period of time that the sense amplifier receives a clock signal from the clock signal generator; and a data output circuit being placed in a high impedance state when the sense amplifier is initialized, outputting the amplified signal from the sense amplifier during a period that the clock signal is being generated, retaining the amplified signal during a period that the clock signal generator stops, and outputting a signal corresponding to the data as is read out of the selected memory cell and outputted from the sense amplifier.

In the SRAM thus arranged, in a read mode, the output terminal of the data output circuit is placed in a high impedance state during a period from the inputting of an address signal till the outputting of the data read out of a memory cell specified by the address signal. Therefore, when the data currently read out is different from the data previously read out, no through-current flows between a power source and a around potential.

Therefore, the SRAM according to the present invention is free from the read time delay and the malfunction, which are the problems of the prior art.

BRIEF DESCRIPTION OF THE DRAWINGS

FIG. 1 is a block diagram showing an arrangement of an SRAM according to an embodiment of the present invention;

FIG. 6 is a circuit diagram showing the details a part of the SRAM circuit shown in FIG. 1, which is a circuit arrangement containing a data output circuit and a data output detector; and FIG. 7 is a circuit diagram showing the details a part of the SRAM circuit shown in FIG. 1, which is another circuit arrangement containing a data output circuit and a data output detector.

DETAILED DESCRIPTION OF THE PREFERRED EMBODIMENTS

Figure 2:
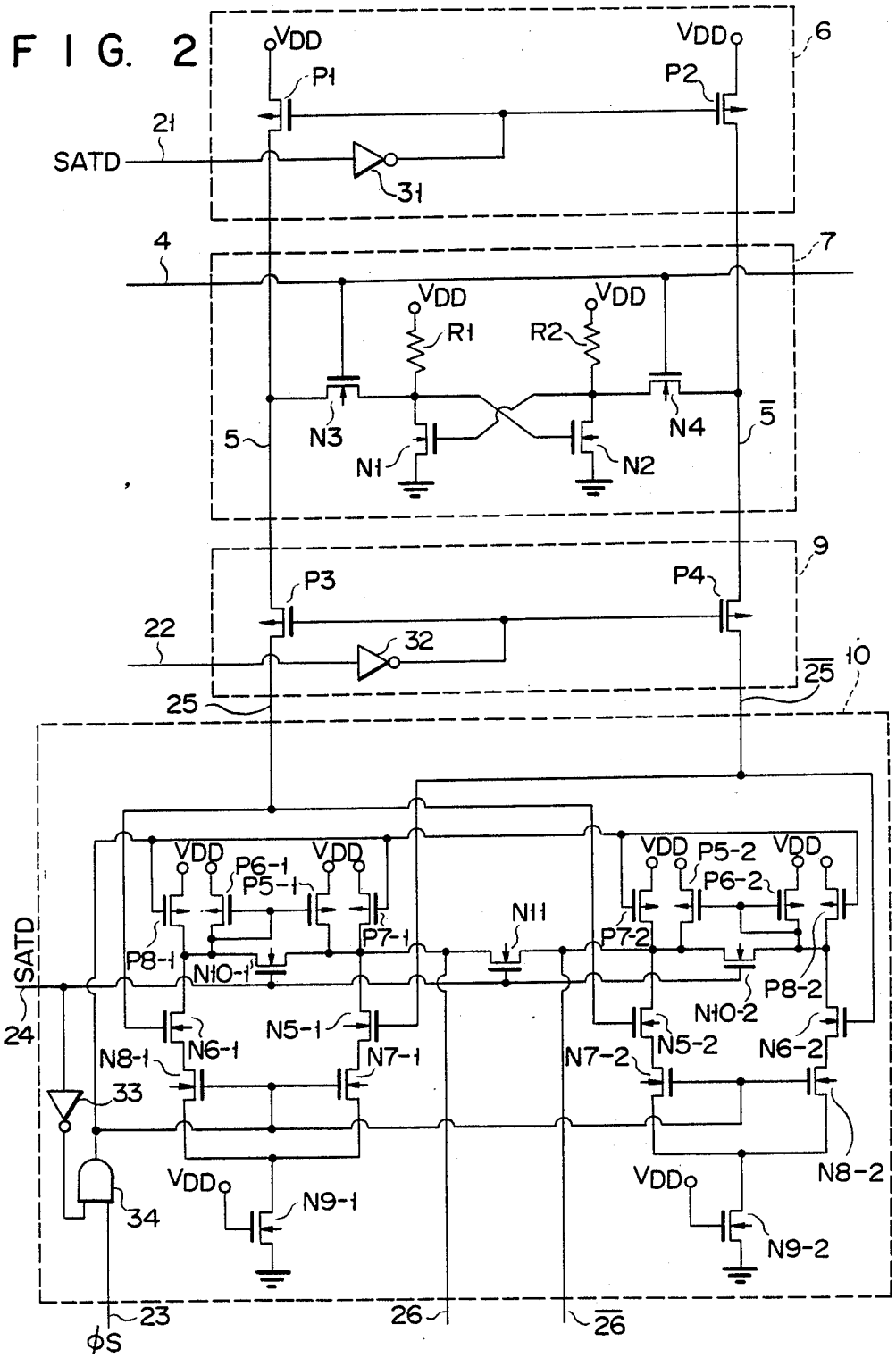
FIG. 2 is a circuit diagram showing the details a part of the SRAM circuit shown in FIG. 1, which contains a bit line initializing circuit, a memory cell, a column select circuit, and a sense amplifier, which are provided in connection with one column of a memory cell array.

FIG. 1 is a block diagram showing an arrangement of an SRAM according to a first embodiment of the present invention. An address input terminal 1 to which an address signal Add is applied is connected to the input terminal of an address input circuit 2. The output terminal of the address input circuit 2 is connected to the input terminal of a row decoder 3. The row decoder 3 decodes a row address signal derived from the address input circuit 2. Word lines 4 are connected to the output terminals of the row decoder 3. The word lines 4 are selectively driven by an output signal of the row decoder 3. Paired bit lines 5 and $\bar{5}$ are disposed orthogonal to the word lines 4. Each pair of bit lines 5 and $\bar{5}$ is coupled at first end to a bit line initializing circuit 6, which is provided in association with the bit line pair. Each bit line initializing circuit 6 is for initializing a potential of the paired bit lines 5 and $\bar{5}$ to a predetermined potential. Static memory cells 7 are located at the cross-points of the word lines 4 and the bit line pairs 5 and $\bar{5}$, respectively, forming a matrix array MA of the memory cells. The input terminal of a column decoder 8 is connected to the output terminal of the address input circuit 2. The column decoder 8 decodes a column address signal derived from the address input circuit 2. Each column selector 9 is connected to a second terminal of the bit line pair 5 and $\bar{5}$, which is provided in association with the column selector 9. The column selector 9 is driven by a column select signal supplied through an output line 22 of the column decoder 8. A sense amplifier 10 is connected at the input terminal to the output terminal of the column selector 9, through a pair of sense amplifier input lines 25 and $\overline{25}$. The sense amplifier 10 amplifies the data read out from a memory cell which is selected by the cooperation of the row decoder 3 and the column decoder 8. A data output circuit 11 is connected to the output terminals of the sense amplifier 10, through a pair of sense amplifier output lines 26 and $\overline{26}$. A data output terminal 12 is connected to the output terminal of the sense amplifier 10. The data, which is read out of the memory cell 7 and amplified by the sense amplifier 10, is applied through the data output circuit 11 to the data output terminal 12 and is outputted to exterior. The input terminal of an address transition detector 13 is connected to the address input circuit 2. In a read mode, the address transition detector 13 detects a transition of an address signal inputted to the address input circuit 2, and produces an address transition detect signal SATD. The address transition detect signal SATD is supplied through an output line 21 of the address transistor detector 13 to the bit line initializing circuits 6, through an output line 24 to the sense amplifier 10, and through an output line 27 to a clock signal generator 14. The clock signal generator 14 receives the address transition detect signal SATD from the address transition detector 13, and produces a clock signal $\phi S$ that is effective in level for a fixed period. The clock signal $\phi S$ is applied through a clock signal line 23 to the sense amplifier 10 and the data output circuit 11, so that those circuits are rendered active during the fixed period.

FIG. 2 shows the details of an arrangement of a part of the SRAM circuit of FIG. 1, which contains the bit line initializing circuit 6, memory cell 7, row selector 9, and sense amplifier 10 which are provided in connection with one column of the memory cell array MA. As shown, the bit line initializing circuit 6 is made up of a pair of p-channel MOSFETs P1 and P2, and an inverter 31. The source of the MOSFET P1 is connected to a power source $V_{DD}$, and the drain thereof to the bit line 5. Similarly, the source of the MOSFET P2 is connected to the power source $V_{DD}$, and the drain thereof to the bit line $\bar{5}$. The gates of the MOSFETs P1 and P2 are connected together, and a connection point of those gates is connected to the output terminal of the inverter 31. The input terminal of the inverter 31 is connected to the output line 21 of the address transition detector 13. With this connection, the address transition detector 13 supplies the address transition detect signal SATD to the inverter 31.

In the bit line initializing circuit 6, when the address transition detect signal SATD goes high, the MOSFETs P1 and P2 are both turned on to initialize the bit line pair 5 and $\bar{5}$ and set it at a level of a power source voltage $V_{DD}$.

The memory cell 7 is made up of resistors R1 and R2 as high resistance loads, drive MOSFETs N1 and N2, and transfer MOSFETs N3 and N4. The resistor R1 is connected at one end to the power source $V_{DD}$ and at the other end to the drain of the drive MOSFET N1. The resistor R2 is connected at one end to the power source $V_{DD}$ and at the other end to the drain of the drive MOSFET N2. The gate of the drive MOSFET N1 is connected to the drain of the drive MOSFET N2 and the source thereof to a ground point. The gate of the drive MOSFET N2 is connected to the drain of the drive MOSFET N1 and the source thereof to a ground point. A current path between the source and drain of the transfer MOSFET N3 is inserted between the bit line 5 and the drain of the drive MOSFET N1. A current path between the source and drain of the transfer MOSFET N4 is inserted between the bit line $\bar{5}$ and the drain of the drive MOSFET N2. The word line 4 is connected to the gates of the MOSFETs N3 and N4.

In the memory cell 7, one of the drive MOSFETs N1 and N2 is in an on state and the other in an off state in accordance with the content of the stored data. When the word line 4 is selected and goes high, the transfer MOSFETs N3 and N4 are both turned on. A potential of the bit line connected to the drive MOSFET being in an on state drops, while a potential of the bit line connected to the drive MOSFET being in an off state is maintained in $V_{DD}$ level.

The column selector 9 is made up of p-channel MOSFETs P3 and P4, and an inverter 32. The drain of the MOSFET P3 is connected to the bit line 5, and the drain of the MOSFET P4 to the bit line $\bar{5}$. The source of the MOSFET P3 is connected to one end of a sense amplifier input line 25, and the source of the MOSFET P4 is connected to one end of a sense amplifier input line $\overline{25}$. The gates of the MOSFETs P3 and P4 are connected together, and a connection point of these gates is connected to the output terminal of the inverter 32. The input terminal of the inverter 32 is connected to an output line 22 of the column decoder 8, and supplied with a column select signal from the decoder 8.

When one output line 22 of the column decoder 8 goes high, the column selector 9 connected with that output line 22 is selected. In the selected column selector 9, the MOSFETs P3 and P4 are both turned on. As a result, the bit line pair 5 and $\bar{5}$ and the input line pair 25 and $\overline{25}$ are coupled with each other.

The sense amplifier 10 is made up of input MOSFETs of n-channel N5-1, N6-1, N5-2, and N6-2, control MOSFETs of n-channel N7-1, N8-1, N7-2 and N8-2, current restricting MOSFETs of n-channel N9-1 and N9-2, potential equalizing MOSFETs of n-channel N10-1, N10-2, and N11, load MOSFETs of p-channel P5-1, P6-1, P5-2, and P6-2, p-channel MOSFETs for sense amplifier initialization P7-1, P8-1, P7-2 and P8-2, an inverter 33, and an AND gate 34. The other end of the sense amplifier input line 25 is connected to the gates of MOSFETs N6-1 and N5-2. The current paths of the MOSFETs P8-1 and P6-1 are connected in parallel between the drain of the MOSFET N6-1 and the power source $V_{DD}$. The other end of the sense amplifier input line $\overline{25}$ is connected to the gates of MOSFETs P7-1 and P5-1. The current paths of the MOSFETs P7-1 and P5-1 are connected in parallel between the drain of the MOSFET N5-1 and the power source $V_{DD}$. The gates of the MOSFETs P8-1 and P7-1 are connected to the output terminal of the AND gate 34. The gates of the MOSFETs P6-1 and P5-1 are connected together, and a connection point of them is further connected to the drain of the MOSFET P6-1. A current path between the source and drain of the MOSFET N10-1 is inserted between the drain of the MOSFET P6-1 and the drain of the MOSFET P5-1. The gate of the MOSFET N10-1 is connected to the output line 24 of the address transition detector 13. The source of the MOSFET N6-1 is connected to the drain of the MOSFET N8-1, and the source of the MOSFET N5-1 is connected to the drain of the MOSFET N7-1. The sources of the MOSFETs N8-1 and N7-1 are connected together and the gates of them are connected to the output terminal of the AND gate 34. One of e input terminals of the AND gate 34 is connected to a clock signal line 23, and the other input terminal thereof is connected to the output terminal of the inverter 33. The input terminal of the inverter 33 is connected to the output line 24. A source-drain current path of the MOSFET N9-1 is connected to a ground point and a node where the sources of the MOSFETs N8-1 and N7-1 are interconnected. The gate of the MOSFET N9-1 is connected to the power source $V_{DD}$.

The current paths of the MOSFETs P7-2 and P5-2 are connected in parallel between the drain of the MOSFET N5-2 and the power source $V_{DD}$. The current paths of the MOSFETs P8-2 and P6-2 are connected in parallel between the drain of the MOSFET N6-2 and the power source $V_{DD}$. The gates of the MOSFETs P6-2 and P8-2 are connected to the output terminal of the AND gate 34. The gates of the MOSFETs P5-2 and P6-2 are interconnected and then to the drain of the MOSFET P6-2. The current path between the source and drain of the MOSFET N10-2 is connected between the drain of the MOSFET P5-2 and the drain of the MOSFET P6-2. The gate of the MOSFET N10-2 is connected to the output line 24 of the address transition detector 13. The source of the MOSFET N5-2 is coupled with the drain of the MOSFET N7-2, and The source of the MOSFET N6-2 is coupled with the drain of the MOSFET N8-2. The sources of the MOSFETs N7-2 and N8-2 are interconnected and the gates of them is connected to the output terminal of the AND gate 34. A source-drain current path of the MOSFET N9-2 is connected between a around point and a connection point interconnecting the sources of the MOSFETs N7-2 and N8-2. The gate of the MOSFET N9-2 is connected to the power source $V_{DD}$.

A source-drain current path of the MOSFET N11 is inserted between the drains of the MOSFETs N5-1 and N5-2. The gate of the MOSFET N11 is connected to the output line 24. The drain of the MOSFET N5-1 is connected to one end of the sense amplifier output line 26, and the drain of the MOSFET N5-2 is connected to one end of the sense amplifier output line $\overline{26}$.

The sense amplifier thus arranged will operate in the following way. A transition of an address signal Add is detected by the address transition detector 13, so that an address transition detect signal SATD from the detector goes high. The signal SATD renders a clock signal $\phi S$ produced from the clock signal generator 14 high in level. The MOSFETs N10-1, N10-2, N11, P8-1, P7-1, P7-2 and P8-2 are all turned on, while the MOSFETs N8-1, N7-1, N7-2, and N8-2 are all turned off. Under this condition, the potentials at the output node of the sense amplifier 10 and the sense amplifier output line pair 26 and $\overline{26}$ are initialized and set at a potential level of the power source voltage $V_{DD}$. The address transition detect signal SATD goes high, and the clock signal $\phi S$ maintains a high level. Under this condition, the MOSFETs N10-1, N10-2, N11, P8-1, P7-1, P7-2 and P8-2 are all turned off, while the MOSFETs N8-1, N7-1, N7-2, and N8-2 are all turned on. Then, the sense amplifier 10 becomes active, and amplifies a potential difference between paired input lines 25 and $\overline{25}$ for the sense amplifier. After a predetermined period of time, the clock signal $\phi S$ goes low, the MOSFETs P8-1, P7-1, P7-2, and P8-2 are all turned on, and the MOSFETs N8-1, N7-1, N7-2, and N8-2 are all turned off. Accordingly, the sense amplifier 10 becomes inactive.

Figure 3:
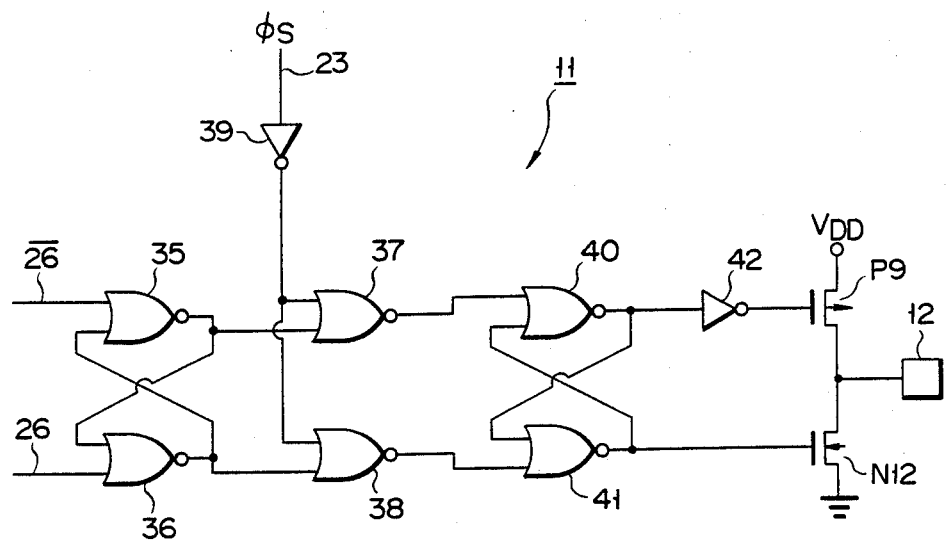
FIG. 3 is a circuit diagram showing an arrangement of a data output circuit in the FIG. 1 circuit.

Turning now to FIG. 3, there is shown the details of the data output circuit 11 in the FIG. 1 circuit. The data output circuit 11 is made up of 2-input NOR gates 35 to 38, 40, and 41, inverters 39 and 42, a pull-up MOSFET P9 of p-channel, and a pull-down MOSFET N12 of n-channel. The 2-input NOR gates 35 to 38, 40, and 41, and the inverters 39 and 42 make up a master slave flip-flop. The MOSFETs P9 and N12 are turned on and off by the flip-flop. One of the input terminals of the NOR gate 35 is connected to the other end of the sense amplifier output line $\overline{26}$, and one of the input terminals of the NOR gate 36 is connected to the other end of the sense amplifier output line 26. The other input terminal of the NOR gate 35 is connected to the output terminal of the NOR gate 36, and the other input terminal of the NOR gate 36 is connected to the output terminal of the NOR gate 35. The output terminal of the NOR gate 35 is connected to the one of the input terminals of the NOR gate 37, and the output terminal of the NOR gate 36 is connected to one of the input terminals of the NOR gate 38. The other input terminals of the NOR gates 37 and 38 are connected to the output terminal of the inverter 39. The input terminal of the inverter 39 is connected to the output line 23 of the address transition detector 13. One of the input terminals of the NOR gate 40 is connected to the output terminal of the NOR gate 37, and one of the input terminals of the NOR gate 41 is connected to the output terminal of the NOR gate 38. The output terminal of the NOR gate 41 is connected to the other input terminal of the NOR gate 40, and The output terminal of the NOR gate 40 is connected to the other input terminal of the NOR gate 41. The output terminal of the NOR gate 40 is connected to the input terminal of the inverter 42. The output terminal inverter 42 is connected to the gate of the MOSFET P9. The source of the MOSFET P9 is connected to the power source $V_{DD}$, and the drain of it is connected to the data output terminal 12 and the drain of the MOSFET N12. The output terminal of the NOR gate 41 is connected to the gate of the MOSFET N12 whose source is grounded.

In operation, during a period that a clock signal $\phi S$ outputted from the clock generator 14 is high, MOSFETs P9 and N12 are both turned off. During a low level period of the clock signal $\phi S$, one of the MOS- FETs is turned on, while the other is turned off in accordance with the potentials of the sense amplifier output lines 26 and $\overline{26}$. To be more specific, as already described, when the address transition detect signal SATD and the clock signal $\phi$S become both high in level, the sense amplifier 10 is initialized and the sense amplifier output lines 26 and $\overline{26}$ become high. Accordingly, the output signals of the NOR gates 35 and 36 go low in level. Since the clock signal $\phi$S is high, the two input terminals of each NOR gate 37 and 38 are set in a low level. In turn, the output signals of the NOR gates 37 and 38 go high, so that the output signals of the NOR gates 40 and 41 also go high. The MOSFETs P9 and N12 are both turned off, and in turn the data output terminal 12 has a high impedance. When the clock signal $\phi$S goes low (at this time the sense amplifier output line pair 26 and $\overline{26}$ is placed such that one of them is set in a high level and the other in a low level in accordance with the data read out of the selected memory cell), one of the MOSFETs is turned on and the other is turned off in accordance with the potentials of the output lines 26 and $\overline{26}$. The result is that a high or low signal, which depends on the read data, is derived from the data output terminal 12.

A read operation of the SRAM illustrated in FIGS. 1 through 3 will be described. An address signal Add is supplied to the address input circuit 2 through the address input terminal 1. A row address signal contained in the address signal Add is applied to the row decoder 3, and a column address signal also contained in the same is applied to the column decoder 8. At this time, the address transition detector 13 detects a transition of the address signal Add, and produces an address transition detect signal SATD. This signal SATD is supplied to the bit line initializing circuits 6, to initialize both of the paired bit lines 5 and $\overline{5}$ and set them in the level of the power soruce voltage $V_{DD}$. At the same time, the row decoder 3 decodes a row address to select a specific word line 4. The memory cells 7 coupled with the selected word line 4 are all selected. A potential difference is caused between the paired bit lines 5 and $\overline{5}$ coupled with these memory cells 7. The column decoder 8 decodes a column address, and selects one column selector 9. The potential difference between the paired bit lines 5 and $\overline{5}$ of the selected column selector 9 is transferred to the sense amplifier 10. The address transition detect signal SATD drives the clock signal generator 14 which in turn generates a clock signal during a fixed period of time. The output line pair 26 and $\overline{26}$ of the sense amplifier 10 is initialized and set at the power soruce voltage $V_{DD}$ level. Thereafter, during a high level period of the clock signal $\phi$S, the active state of the sense amplifier 10 continues. Under this condition, the potential difference between the paired bit lines 5 and $\overline{5}$, and the potential difference is supplied to the data output circuit 11. At this time, the output line pair 26 and $\overline{26}$ for the sense amplifier 10 is initialized to the $V_{DD}$ level, so that the data output terminal 12 exhibits a high impedance. Then, after the sense amplifier 10 operates, it outputs the data. After a predetermined period of time, the clock signal $\phi$S is returned to be low, to render the sense amplifier 10 inactive. The data output circuit 11 continues the outputting of data Dout via the data output terminal 12.

With such an arrangement of the SRAM, in a read mode, during a period from the inputting of the address signal Add till the outputting of the data read out of the memory cell at that address, the MOSFETs P9 and N12 in the data output circuit 11 are both in an off state. The result is that the output terminal of the data output circuit 11 (data output terminal 12) is kept high in impedance. Therefore, even when the present data is different from the data previously read out, no through current flows between the power source $V_{DD}$ and a ground point. Consequently, the SRAM can minimize the read time delay and malfunction problem due to the power noise.

Figure 4:
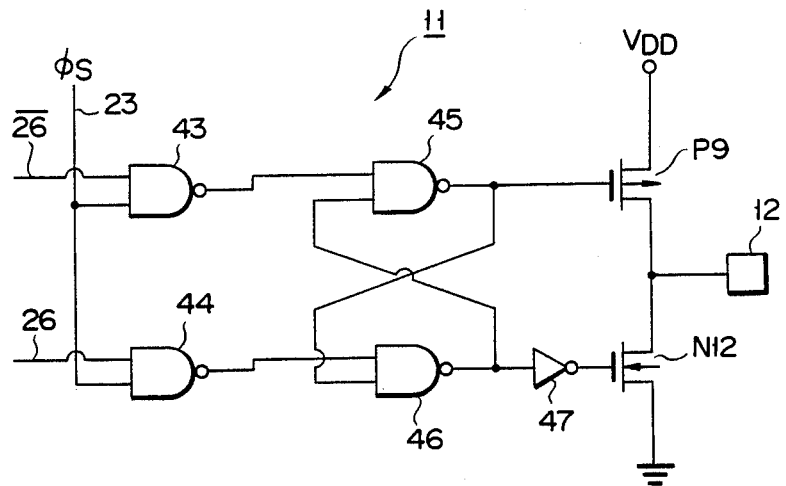
FIG. 4 is a circuit diagram showing another arrangement of a data output circuit in the FIG. 1 circuit.

In FIG. 4, there is shown another configuration of the data output circuit 11, which is available for the SRAM of FIG. 1. The data output circuit 11 is composed of 2-input NAND gates 43 to 46, inverter 47, pull-up MOSFET of p-channel P9, and pull-down MOSFET of n-channel N12. The present circuit configuration, like the FIG. 3 circuit, constitutes a master slave flip-flop. One of the input terminals of the NAN gate 43 is connected to the other end of the sense amplifier output line $\overline{26}$, and one of the input terminals of the NAND gate 44 is connected to the other end of the sense amplifier output line 26. The other input terminals of the NAND gates 43 and 44 are coupled with the output line 23 of the address transition detector 13. One of the input terminals of the NAND gate 44 is connected to the output terminal of the NAND gate 43, and one of the input terminals of the NAND gate 46 is connected to the output terminal of the NAND gate 44. The output terminal of the NAND gate 46 is connected to the other input terminal of the NAND gate 45, and the output terminal of the NAND gate 45 is connected to the other input terminal of the NAND gate 46. The output terminal of the NAND gate 45 is connected to the gate of the MOSFET P9. The source of the MOSFET P9 is connected to the power source $V_{DD}$, and its drain is connected to the data output terminal 12 and the drain of the MOSFET N12. The output terminal of the NAND gate 46 is connected to the input terminal of the inverter 47, and the output terminal of this inverter is connected to the gate of the MOSFET N12 whose source is grounded.

The above configuration of the data output circuit 11 has a similar logic operation to that of the FIG. 3 configuration.

Figure 5:
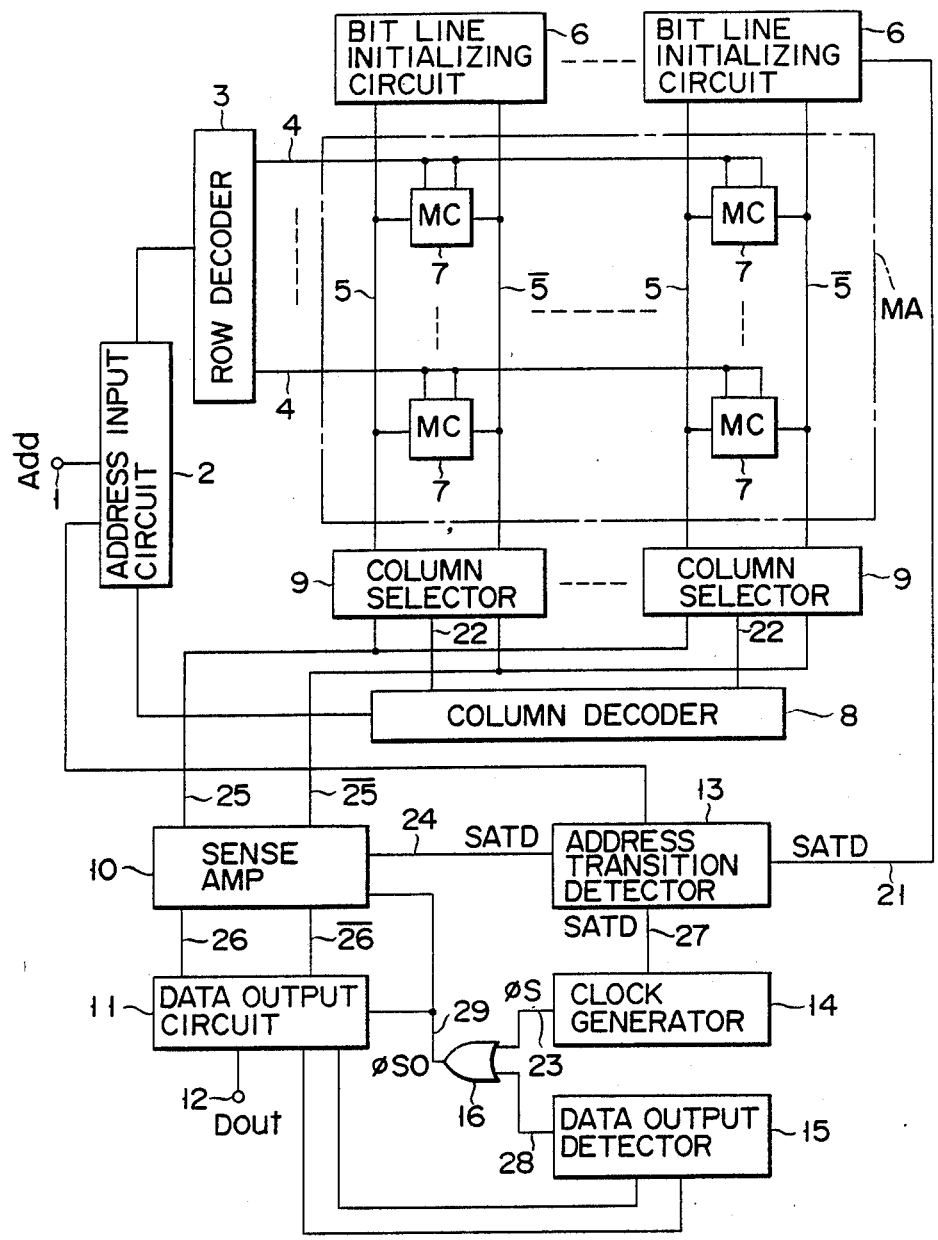
FIG. 5 is a block diagram showing an arrangement of an SRAM according to another embodiment of the present invention.

FIG. 5 shows a circuit configuration of an SRAM according to a second embodiment of the present invention. The FIG. 5 configuration improves over the FIG. 1 circuit in that a power dissipation is reduced in a read mode, and a read operation is more reliable.

For simplicity, like reference symbols are used for designating like or equivalent portions in FIG. 1, and elaboration of them will be omitted. A data output circuit 11 is connected to the input terminal of a data output detector 15. An output line 28 of the data output detector 15 is connected to one of the input terminals of an OR gate 16. The other input terminal of the OR gate 16 is connected to a clock signal line 23 also coupled with the output terminal of a clock signal generator 14. A signal line 29 coupled with the output terminal of the OR gate 16 is connected to a sense amplifier 10 and a data output circuit 11.

A circuit configuration of a part of the SRAM of FIG. 5, which contains a bit line initializing circuit 6, memory cell 7, column selector 9, and sense amplifier 10 which are provided in connection with one column line of an memory cell array MA, is the same as the FIG. 2 configuration.

FIG. 6 shows the details of the data output circuit 11 and the data output detector 15 in the FIG. 5 circuit. A configuration of the circuit 11 is the same as that of the FIG. 3 circuit. The data output detector 15 consists of a 2-input NOR gate 48. The output terminal of the NOR gate 40 is connected to one of the input terminals of the NOR gate 48, while the output terminal of the NOR gate 41 to the other input terminal. The output terminal of the NOR gate 48 is connected to the output line 28.

An operation of the circuit illustrated in FIGS. 5 and 6 will be described. In the FIG. 5 circuit, an operation that after an address signal Add is inputted, the data from a selected memory cell 7 is supplied to the data output circuit 11 and is derived from the output terminal 12, is substantially the same as that of the FIG. 1 circuit. The SRAM of the second embodiment is different from the FIG. 1 circuit of the first embodiment in that a signal $\phi SO$ as a logical sum of an output signal of the data output detector 15 and a clock signal $\phi S$ from the clock signal generator 14 is used for controlling the sense amplifier 10 and the data output circuit 11. So long as the data output detector 15 detects the data outputting, if the clock signal $\phi S$ goes low, the sense amplifier 10 and the data output circuit 11 are continuously active. In the case of the FIG. 1 circuit, a high level period of the clock signal $\phi S$ is preset, as recalled. Therefore, a drive force by the memory cell 7 for the bit line pair 5 and $\bar{5}$ is weak. In a situation that a long time is taken till the data is outputted through the sense amplifier 10 to the data output circuit 11, the clock signal $\phi S$ may go low before the read operation ends. In such a case, the read operation is imperfect. On the other hand, the FIG. 5 circuit can successfully cope with such a situation. When the SRAM is placed in such a situation, the output signal of the data output detector 15 continuously activates the sense amplifier 10 and the data output circuit 11. Therefore, the read operation will be normally performed even when the drive force by the memory cell 7 for the bit line pair 5 and $\bar{5}$ is weak. Additionally, an appropriate adjustment of a time length of generating the clock signal $\phi S$ may reduce a power dissipation when the drive force of the memory cell 7. Specifically, the clock signal $\phi S$ is pulsed from a high level to a low level immediately after the signal $\phi S$ goes high to activate the sense amplifier 10 and the data output circuit 11, and the data output detector 15 produces a signal to activate the sense amplifier 10 and the data output circuit 11. If so pulsed, the memory cell 7 forcibly drives the bit line pair 5 and $\bar{5}$. When the data is quickly applied through the sense amplifier to the data output circuit 11, the output signal of the data output detector 15 goes low immediately. Accordingly, the sense amplifier 10 and the data output circuit 11 are quickly rendered inactive, reducing a power dissipation by the sense amplifier 10 and the data output circuit 11.

As seen from the foregoing, in the second embodiment, in a read mode, after the reading out data from the memory cell is detected, the read mode is terminated. Accordingly, the read operation is more reliable with a lessened power dissipation.

Another circuit configuration containing the data output circuit 11 and the data output detector 15 is shown in FIG. 7. The data output circuit 11 has the same configuration as that of the FIG. 4 circuit. The data output detector 15 is made up of a 2-input AND gate 49. The output terminal of a NAND gate 45 is connected to one of the input terminals of the AND gate 49, and the output terminal of a NAND gate 46 is connected to the other input terminal. The output terminal of the AND gate 49 is connected to the output line 28.

The FIG. 7 circuit has substantially the same logical operation and the beneficial effects as the FIG. 6 circuit.

What is claimed is:

1. A static random access memory comprising:
   a memory cell array containing a plurality of static memory cells for storing data in a matrix fashion;
   a plurality of word lines for selecting rows of the memory cells in said memory cell array, said word lines being arranged in respect to the rows of said memory cell array;
   a plurality of bit line pairs being arranged in respect to columns of the memory cells in said memory cell array, each of said bit line pairs selecting a different one of the columns of said memory cells for transferring data to and from one of the memory cells coupled to said selected column;
   address inputting means for providing an address signal corresponding to a different one of said memory cells of said memory cell array;
   row decoder means for providing a row address signal in response to said address inputting means to selectively drive said word lines;
   column decoder means for providing a column address signal in response to said address inputting means to select one of said bit line pairs;
   address transition detector means for detecting transition of said address signal in response to said address inputting means and providing a corresponding address transition detect signal;
   bit line initializing means for setting said plurality of paired bit lines to an initial potential in response to said address transition detect signal;
   means for generating a clock signal in a read mode at a predetermined time in response to said address transition detect signal;
   sense amplifier means coupled to said paired bit lines for amplifying data transmitted from a selected one of the memory cells to a respective one of the said bit line pairs, said sense amplifier means including a differential amplifier means for differentially amplifying potentials sensed from said respective bit line pair, a differential amplifier initializing means for setting the output nodes of said differential amplifier means to an initial potential in response to said address transition detector means, and control means for activating and deactivating said differential amplifier means in response to said generated clock signal, said sense amplifier means being set to an initial potential in response to said address transition detect signal set to a neutral potential in response to said generated clock signal; and
   data output means for transmitting said amplified data in response to said generated clock signal, said data output means being placed in a high impedance state in response to said sense amplifier means being set to the initial potential, retaining the amplified data at times when said clock signal generating means is inoperative, and transmitting a signal corresponding to said amplified data.

2. The static random access memory according to claim 1, wherein said sense amplifier means includes a first MOSFET of a first conductivity type coupled at the gate with one of said selected paired bit lines, a second MOSFET of the first conductivity type coupled at the gate with the other of said selected paired bit lines, an AND gate receiving at one input terminal a clock signal from said clock signal generator means and at the other input terminal the inverted signal of the address transition detect signal, a third MOSFET of a second conductivity type whose current path is connected between one end of the current path of said first MOSFET and a first potential source, and whose conduction is controlled by the output signal of said AND gate, a 4th MOSFET of the second conductivity type whose current path is connected between one end of the current path of said second MOSFET and said first potential source, and whose conduction is controlled by the output signal of said AND gate, a 5th MOSFET of the second conductivity type whose current path is connected in parallel with the current path of said third MOSFET, a 6th MOSFET of the second conductivity type whose current path is connected in parallel with the current path of said 4th MOSFET, and whose gate is connected to the gate of said 5th MOSFET, a 7th MOSFET of the first conductivity type whose current path is connected between one end of the current path of said first MOSFET and one end of the current path of said second MOSFET, and whose gate is coupled for reception with the address transition detect signal, an 8th MOSFET of the first conductivity type whose current path is connected at one end to the other end of the current path of said first MOSFET, and whose gate is coupled for reception with the output signal of said AND gate, a 9th MOSFET of the first conductivity type whose current path is connected at one end to the other end of the current path of said second MOSFET, and at the other end with the other end of said 8th MOSFET, and whose gate is coupled for reception with the output signal of said AND gate, a 10th MOSFET of the first conductivity type whose current path is connected at one end to the other ends of the current paths of said 8th and 9th MOSFETs, and at the other end with a second potential source, and whose gate is coupled with said first potential source, an 11th MOSFET of the first conductivity type whose gate is coupled with the gate of said first MOSFET, a 12th MOSFET of the first conductivity type whose gate is coupled with the gate of said second MOSFET, a 13th MOSFET of the second conductivity type whose current path is connected between one end of a current path of said 11th MOSFET and said first potential source, and whose conduction is controlled by the output signal of said AND gate, a 14th MOSFET of the second conductivity type whose current path is connected between one end of the current path of said 12th MOSFET and said first potential source, and whose conduction is controlled by the output signal of said AND gate, a 15th MOSFET of the second conductivity type whose current path is connected in parallel with the current path of said 13th MOSFET, a 16th MOSFET of the second conductivity type whose current path is connected in parallel with the current path of said 14th MOSFET and whose gate is coupled with the gate of said 15th MOSFET and one end of the current path of said 11th MOSFET, a 17th MOSFET of the first conductivity type whose current path is connected between one end of the current path of said 11th MOSFET and one end of the current path of said 12th MOSFET and one end of the current path of said 12th MOSFET, and whose gate is coupled for reception with the address transition detect signal, an 18th MOSFET of the first conductivity type whose current path is connected at one end to the other end of the current path of said 11th MOSFET, and whose gate is coupled for reception with the output signal of said AND gate, a 19th MOSFET of the first conductivity type whose current path is connected at one end to the other end of the current path of said 12th MOSFET and at the other end to the other end of the current path of said 18th MOSFET, and whose gate is coupled for reception with the output signal of said AND gate, a 20th MOSFET of the first conductivity type whose current path is connected at one end to the other ends of the current paths of said 18th and 19th MOSFETS, and at the other end with said second potential source, and whose gate is coupled with said first potential source, a 21st MOSFET of the first conductivity type whose current path is connected between one end of the current path of said second MOSFET and one end of the current path of said 11th MOSFET, and whose conduction is controlled by the address transition detect signal, a first sense amplifier output line coupled with one end of the current path of said second MOSFET, and a second sense amplifier output line coupled with one end of the current path of said 11th MOSFET, said first, second, 5th, 6th, 10th, 11th, 12th, 15th, 16th, and 20th MOSFETs serving as said differential amplifier means, said third, 4th, 7th, 13th, 17th and 21st MOSFETs serving as said differential amplifier initializing means, and said 8th, 9th, 18th and 19th MOSFETs serving as said control means.

3. The static random access memory according to claim 1, wherein said data output means includes a master slave flip-flop being reset when the output terminal of said sense amplifier means is pulled up in synchronism with said address transition detect signal, outputting allowing said sense amplifier means to pass an output signal therethrough when said clock signal is being generated, an being placed in a data hold state at the termination of said clock signal, a pull-up means being turned on and off in accordance with the output signal of said flip-flop and for pulling up the output terminal, and a pull-down means being turned on and off in accordance with the output signal of said flip-flop and for pulling down the output terminal.

4. The static random access memory according to claim 1, wherein said data output means includes a first NOR gate having two input terminals, one of said input terminals being connected to the first output line of said sense amplifier means, a second NOR gate having two input terminals, one of said input terminals being connected to the second output line of said sense amplifier means, and the other input terminal being connected to the output terminal of said first NOR gate, and an output terminal of said second NOR gate being the other input terminal of said first NOR gate, a third NOR gate having two input terminals, one of said input terminals being connected to the output terminal of said first NOR gate, a fourth NOR gate having two input terminals, one of said input terminals being connected to the output terminal of said second NOR gate, a first inverter connected at the input terminal to the output line of said clock signal generator means, at the output terminal to the other input terminals of said third and fourth NOR gates, a fifth NOR gate connected at one of the input terminals to the output terminal of said third NOR gate, a sixth NOR gate coupled at one of the input terminals with the output terminal of said fourth NOR gate, at the other input terminal with the output terminal of said fifth NOR gate, and at the output terminal with the other input terminal of said fifth NOR gate, a second inverter coupled at the input terminal with the output terminal of said fifth NOR gate, a first MOSFET of a first conductivity type whose current path is connected at one end to a first potential source and at the gate to the output terminal of said second inverter, a second MOSFET of a second conductivity type whose current path is connected between the other end of the current path of said first MOSFET and a second potential source and at the gate to the output terminal of said sixth NOR gate, and a data output terminal coupled a connection point between said first MOSFET and second MOSFET.

5. The static random access memory according to claim 1, wherein said data output means includes a first NOR gate having two input terminals, one of said input terminals being connected to the first output line of said sense amplifier means and the other being connected to the output line of said clock signal generator means, a second NAND gate having two input terminals, one of said input terminals being connected to the second output line of said sense amplifier means, and the other input terminal being connected to the output line of said clock signal generator means, a third NAND having two input terminals, one of said input terminals being connected to the output terminal of said first NAND gate, a fourth NAND gate having two input terminals, one of said input terminals being connected to the output terminal of said second NAND gate and at the other input terminal with the output terminal of said third NAND gate, and the output terminal of said fourth NAND gate being connected to the other input terminal of said third NAND gate, an inverter connected at the input terminal to the output terminal of said fourth NAND gate, a first MOSFET of a first conductivity type whose current path is connected at one end to a first potential source and at the gate to the output terminal of said third NAND gate, a second MOSFET of a second conductivity type whose current path is connected between the other end of the current path of said first MOSFET and a second potential source and at the gate to the output terminal of said inverter, and a data output terminal coupled a connection point between said first MOSFET and second MOSFET.

6. The static random access memory according to claim 1, further comprising a data output detector means for detecting whether the output terminal of said data output means is in a high impedance state or a data outputting state, and a logic means for logically summing the output signal of said clock signal generator means and the output signal of said data output detector means and controlling said sense amplifier means and said data output means on the obtained logical sum.

7. The static random access memory according to claim 6, wherein the period of generating a clock signal by said clock signal generator means ranges from an instant that said address transition detector means detects a transition of the address signal till said data output detector means detects the outputting of data.

8. The static random access memory according to claim 6, wherein said logic means includes an OR gate.

9. The static random access memory according to claim 6, wherein said data output means includes a first NOR gate having two input terminals, one of said input terminals being connected to the first output line of said sense amplifier means, a second NOR gate having two input terminals, one of said input terminals being connected to the second output line of said sense amplifier means, and the other input terminal being connected to the output terminal of said first NOR gate, and an output terminal of said second NOR gate being the other input terminal of said first NOR gate, a third NOR gate having two input terminals, one of said input terminals being connected to the output terminal of said first NOR gate, a fourth NOR gate having two input terminals, one of said input terminals being connected to the output terminal of said second NOR gate, a first inverter connected at the input terminal to the output line of said clock signal generator means, at the output terminal to the other input terminals of said third and fourth NOR gates, a fifth NOR gate connected at one of the input terminals to the output terminal of said third NOR gate, a sixth NOR gate coupled at one of the input terminals with the output terminal of said fourth NOR gate, at the other input terminal with the output terminal of said fifth NOR gate, and at the output terminal with the other input terminal of said fifth NOR gate, a second inverter coupled at the input terminal with the output terminal of said fifth NOR gate, a first MOSFET of a first conductivity type whose current path is connected at one end to a first potential source and at the gate to the output terminal of said second inverter, a second MOSFET of a second conductivity type whose current path is connected between the other end of the current path of said first MOSFET and a second potential source and at the gate to the output terminal of said sixth NOR gate and a data output terminal coupled a connection point between said first MOSFET and second MOSFET, and said data output detecting means includes a seventh NOR gate which is coupled at one of the input terminals with the output terminal of said fifth NOR gate, at the other with the output terminal of said sixth NOR gate, and at the output terminal with one of the input terminals of said logic means.

10. The static random access memory according to claim 7, wherein said data output means includes a first NOR gate having two input terminals, one of said input terminals being connected to the first output line of said sense amplifier means and the other being connected to the output line of said clock signal generator means, a second NAND gate having two input terminals, one of said input terminals being connected to the second output line of said sense amplifier means, and the other input terminal being connected to the output line of said clock signal generator means, a third NAND having two input terminals, one of said input terminals being connected to the output terminal of said first NAND gate, a fourth NAND gate having two input terminals, one of said input terminals being connected to the output terminal of said second NAND gate and at the other input terminal with the output terminal of said third NAND gate, and the output terminal of said fourth NAND gate being connected to the other input terminal of said third NAND gate, an inverter connected at the input terminal to the output terminal of said fourth NAND gate, a first MOSFET of a first conductivity type whose current path is connected at one end to a first potential source and at the gate to the output terminal of said third NAND gate, a second MOSFET of a second conductivity type whose current path is connected between the other end of the current path of said first MOSFET and a second potential source and at the gate to the output terminal of said inverter, and a data output terminal coupled a connection point between said first MOSFET and second MOSFET, and said data output detecting means includes an AND gate which is coupled at one of the input terminals with the output terminal of said third NAND gate, at the other with the output terminal of said fourth NAND gate, and at the output terminal with one of the input terminals of said logic means.

11. The static random access memory according to claim 1, wherein said differential amplifier initializing means includes a pull-up means for pulling up the output nodes of said differential amplifier means.

12. The static random access memory according to claim 1, wherein said control means activates said differential amplifier means when said control means receives said generated clock signal, and deactivates said differential amplifier means when said generated clock signal is inoperative.

* * * * *